(12) United States Patent
Chai et al.

(10) Patent No.: US 12,394,496 B2
(45) Date of Patent: Aug. 19, 2025

(54) APPARATUS AND METHOD FOR REDUCING SIGNAL INTERFERENCE IN A SEMICONDUCTOR DEVICE

(71) Applicant: SK hynix Inc., Gyeonggi-do (KR)

(72) Inventors: Soo Yeol Chai, Gyeonggi-do (KR); Jin Haeng Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 529 days.

(21) Appl. No.: 17/730,917

(22) Filed: Apr. 27, 2022

(65) Prior Publication Data
US 2023/0162806 A1    May 25, 2023

(30) Foreign Application Priority Data

Nov. 23, 2021 (KR) .................. 10-2021-0162035

(51) Int. Cl.
*G11C 16/24* (2006.01)
*G11C 16/34* (2006.01)

(52) U.S. Cl.
CPC .......... *G11C 16/3427* (2013.01); *G11C 16/24* (2013.01)

(58) Field of Classification Search
CPC . G11C 16/3427; G11C 16/24; G11C 16/3418; G11C 16/26; G11C 16/0483; G11C 16/32; G11C 16/20; G11C 16/08; G11C 16/10; H01L 27/105
See application file for complete search history.

(56) References Cited

U.S. PATENT DOCUMENTS

| | | | |
|---|---|---|---|
| 7,796,431 B2 | 9/2010 | Chen | |
| 9,087,595 B2 | 7/2015 | Lee | |
| 9,165,672 B2 | 10/2015 | Kang et al. | |
| 10,186,325 B2 | 1/2019 | Helm et al. | |
| 2005/0213381 A1* | 9/2005 | Byeon | G11C 16/26 365/185.11 |
| 2013/0083596 A1* | 4/2013 | Lee | G11C 16/0483 365/185.02 |
| 2016/0012907 A1* | 1/2016 | Kang | G11C 7/1039 365/185.03 |
| 2018/0197967 A1* | 7/2018 | Oh | H01L 27/12 |
| 2018/0335950 A1* | 11/2018 | Jeong | G06F 3/065 |
| 2021/0217479 A1* | 7/2021 | Oh | G11C 7/1084 |

FOREIGN PATENT DOCUMENTS

KR    10-2083450 B1    3/2020

* cited by examiner

*Primary Examiner* — Mohammed A Bashar
(74) *Attorney, Agent, or Firm* — IP & T GROUP LLP

(57) ABSTRACT

A memory device includes a memory structure and a control circuit. The memory structure includes plural page buffers coupled to non-volatile memory cells. Each non-volatile memory cell is capable of storing data. The plural page buffers are disposed in a predetermined direction. The control circuit is configured to separate reset sections of two page buffers from each other by a time corresponding to at least one of the reset sections. The two page buffers are disposed adjacent to each other among the plural page buffers.

22 Claims, 14 Drawing Sheets

APPARATUS AND METHOD FOR REDUCING SIGNAL INTERFERENCE IN A SEMICONDUCTOR DEVICE

CROSS-REFERENCE TO RELATED APPLICATIONS

This patent application claims the benefits of Korean Patent Application No. 10-2021-0162035, filed on Nov. 23, 2021, the entire disclosure of which is incorporated herein by reference.

TECHNICAL FIELD

Embodiments of the present disclosure described herein relate to a semiconductor device, and particularly, to an apparatus and a method for reducing signal interference in the semiconductor device.

BACKGROUND

Recently, a paradigm for a computing environment has shifted to ubiquitous computing, which enables computer systems to be accessed virtually anytime and anywhere. As a result, the use of portable electronic devices (e.g., mobile phones, digital cameras, notebook computers, or the like) is rapidly increasing. Such portable electronic devices each may use or include a memory system having at least one memory device. The memory system may be a data storage device. The data storage device can be used as a main storage device or an auxiliary storage device of a portable electronic device.

Unlike a hard disk, such a data storage device uses non-volatile semiconductor memories, exhibits improved stability and durability, has no mechanical driving parts (e.g., a mechanical arm), and thus provides high data access speeds and relatively low power consumption. Examples of the data storage device having such advantages include, but are not limited to, Universal Serial Bus (USB) memory devices, memory cards having various interfaces, solid state drives (SSDs), and so on.

BRIEF DESCRIPTION OF THE DRAWINGS

The description herein makes reference to the accompanying drawings wherein like reference numerals refer to like parts throughout the figures.

DETAILED DESCRIPTION

Figure 1:
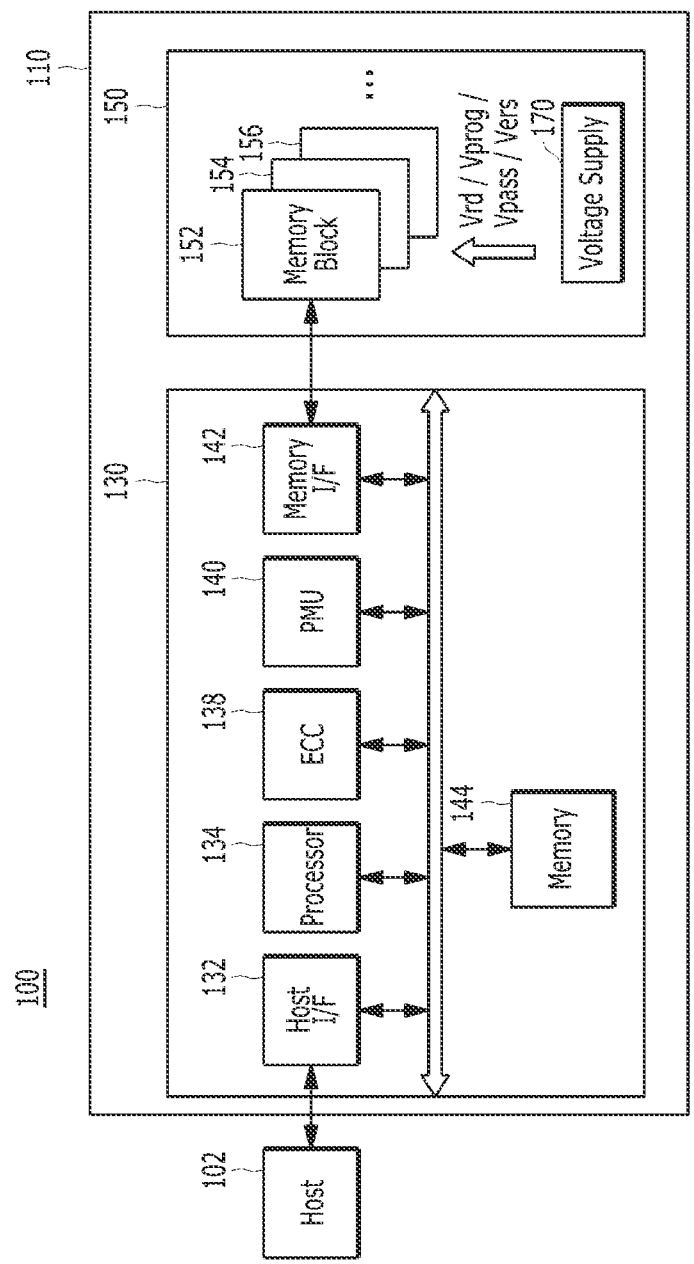
FIG. 1 illustrates a data processing system according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

An embodiment of the disclosure may provide an apparatus and a method for reducing signal interference occurring in a semiconductor device. Further, an embodiment of the disclosure may provide an apparatus and a method capable of improving an integration degree of a memory device.

In an embodiment, a memory device can include a memory structure including plural page buffers coupled to non-volatile memory cells, each non-volatile memory cell capable of storing data, wherein the plural page buffers are disposed in a predetermined direction; and a control circuit configured to separate reset sections of two page buffers from each other by a time corresponding to at least one of the reset sections. The two page buffers can be disposed adjacent to each other among the plural page buffers.

The memory structure can include a bit line coupling at least one non-volatile memory cell among the non-volatile memory cells to at least one plural page buffer among the plural page buffers; and a switching circuit configured to control connection between the bit line and the at least one non-volatile memory cell.

The page buffer can include a sensing node coupled to the switching circuit; and two latches coupled to the sensing node.

The control circuit can be configured to transfer a control signal for resetting one of the two latches included in the page buffer.

The control circuit can separate the reset sections by outputting a first control signal and a second control signal to be applied to the two page buffers. A first activation section of the first control signal and a second activation section of the second control signal can be separated from each other by a time corresponding to at least one of the first activation section or the second activation section.

The first activation section and the second activation section are the same as each other.

The two page buffers can be disposed between neighboring isolation pads formed in a semiconductor substrate.

At least one of the two page buffers disposed between the neighboring isolation pads and at least one of page buffers disposed outside the neighboring isolation pads can have partially overlapped activation sections.

The page buffer can have a width corresponding to 3.5 or 5 lines formed in the semiconductor substrate in a plan view.

In another embodiment, a semiconductor device can include a structure including plural buffers disposed in a predetermined direction, each buffer including a latch storing data; and a control circuit configured to separate respective activation sections of two buffers from each other by a time corresponding to at least one of the activation sections. The two page buffers can be disposed adjacent to each other among the plural page buffers.

The buffer can include a sensing node for receiving or outputting the data; and two latches coupled to the sensing node.

The control circuit can be configured to transfer a control signal for resetting one of the two latches included in the page buffer.

The control circuit can separate the activation sections by outputting a first control signal and a second control signal to be applied to the two buffers. A first activation section of the first control signal and a second activation section of the second control signal can be separated from each other by a time corresponding to at least one of the first activation section or the second activation section.

The first activation section and the second activation section can be the same as each other.

The two page buffers can be disposed between neighboring isolation pads formed in a semiconductor substrate.

At least one of the two page buffers disposed between the neighboring isolation pads and at least one of page buffers disposed outside the neighboring isolation pads can have partially overlapped activation sections.

The buffer can have a width corresponding to 3.5 or 5 lines formed in the semiconductor substrate in a plan view.

In another embodiment, a method for operating a memory device can include applying a first control signal having a first activation section to a first page buffer of two page buffers which are disposed adjacent to each other among plural page buffers; and applying a second control signal having a second activation section to a second page buffer of the two page buffers. The first activation section and the second activation section can be separated from each other by a time corresponding to at least one of the first activation section or the second activation section.

The first and second page buffers can be disposed between neighboring isolation pads formed in a semiconductor substrate.

The first activation section and the second activation section can be the same as each other.

In another embodiment, a memory device can include a memory cell array of columns; first and second page buffers disposed physically adjacent to each other and each including first and second latches coupled to a corresponding column, the second latch of the first page buffer being disposed physically adjacent to the first latch of the second page buffer; and a control circuit configured to apply first and second signals to the respective first latches to reset the first latches. The first and second signals can stay enabled during respective time amounts that are separated by any of the time amounts.

Embodiments of the present disclosure will now be described with reference to the accompanying drawings, wherein like numbers reference like elements.

Embodiments of the present disclosure can provide a memory system, a data processing system, and methods for operating the memory system and the data processing system. The data processing system includes components and resources such as a memory system and a host, and is capable of dynamically allocating plural data paths used for data communication between the components based on usages of the components and the resources.

FIG. 1 illustrates a data processing system 100 according to an embodiment of the present disclosure.

Referring to FIG. 1, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

As shown in FIG. 1, the memory device 150 may include a plurality of memory blocks 152, 154, 156. The memory block 152, 154, 156 may be understood as a group of non-volatile memory cells in which data is removed together by a single erase operation. Although not illustrated, the memory block 152, 154, 156 may include a page which is a group of non-volatile memory cells that store data together during a single program operation or output data together during a single read operation. For example, one memory block may include a plurality of pages.

For example, the memory device 150 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood as a set of components implemented on a physically distinguishable substrate. Each memory die may be connected to the controller 130 through a data path. Each memory die may include an interface to exchange an item of data and a signal with the controller 130.

According to an embodiment, the memory device 150 may include at least one memory block 152, 154, 156, at least one memory plane, or at least one memory die. The internal configuration of the memory device 150 shown in FIG. 1 may be different according to performance of the memory system 110. An embodiment of the present disclosure is not limited to the internal configuration shown in FIG. 2.

Referring to FIG. 1, the memory device 150 may include the voltage supply circuit 170 capable of supplying at least some voltage into the memory block 152, 154, 156. The voltage supply circuit 170 can include a voltage generation circuit used for generating target voltages used in the memory block 152, 154, 156, referring to FIGS. 4 to 8. The voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell included in the memory block 152, 154, 156, the voltage supply circuit 170 may supply the read voltage Vrd into a selected non-volatile memory cell. During the program operation for storing data in the non-volatile memory cell included in the memory block 152, 154, 156, the voltage supply circuit 170 may supply the program voltage Vprog into a selected non-volatile memory cell. Also, during a read operation or a program operation performed on the selected non-volatile memory cell, the voltage supply circuit 170 may supply a pass voltage Vpass into a non-selected non-volatile memory cell. During the erasing operation for erasing data stored in the non-volatile memory cell included in the memory block 152, 154, 156, the voltage supply circuit 170 may supply the erase voltage Vers into the memory block.

The memory device 150 may store information regarding various voltages which are supplied to the memory block 152, 154, 156 based on which operation is performed. For example, when a non-volatile memory cell in the memory block 152, 154, 156 can store multi-bit data, plural levels of the read voltage Vrd for recognizing or reading the multi-bit data item may be required. The memory device 150 may include a table including information corresponding to plural levels of the read voltage Vrd, corresponding to the multi-bit data item. For example, the table can include bias values stored in a register, each bias value corresponding to a specific level of the read voltage Vrd. The number of bias values for the read voltage Vrd that is used for a read operation may be limited to a preset range. Also, the bias values can be quantized.

The host 102 may include a portable electronic device (e.g., a mobile phone, an MP3 player, a laptop computer, etc.) or a non-portable electronic device (e.g., a desktop computer, a game player, a television, a projector, etc.). According to an embodiment, the host 102 can include a central processing unit (CPU) included in the portable electronic device and the non-portable electronic device.

The host 102 may also include at least one operating system (OS), which can control functions and operations performed in the host 102. The OS can provide interoperability between the host 102 engaged operatively with the memory system 110 and a user who intends to store data in the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

Figure 2:
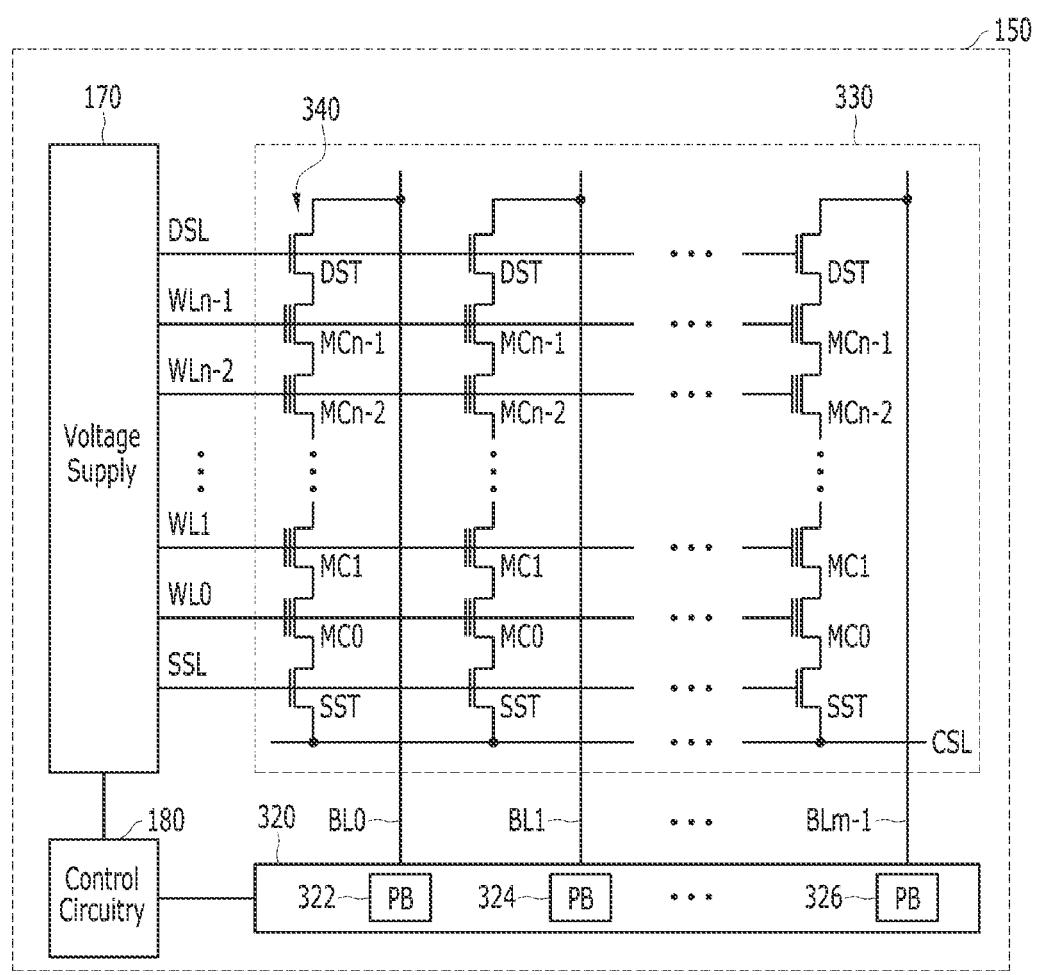
FIG. 2 illustrates a memory device according to an embodiment of the present disclosure.

According to an embodiment, the controller 130 may include a host interface 132, a processor 134, error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 included in the controller 130 may receive signals, commands (or requests), and/or data input from the host 102. For example, the host 102 and the memory system 110 may use a predetermined protocol to transmit and receive data therebetween. Examples of communication standards, protocols or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide a high transmission speed, as compared with other interfaces such as IDE and SATA. In the SCSI, the host 102 and at least one peripheral device (e.g., memory system 110) are connected in series, but data transmission and reception between the host 102 and each peripheral device may be performed through parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In the SAS, the host 102 and a plurality of peripheral devices are connected in series, and data transmission and reception between the host 102 and each peripheral device may be performed in a serial data communication scheme. The SAS can support connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., x1, x4, x8, or x16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not, and outputs an instruction signal (e.g., a correction success signal or a correction fail signal), based on a result of the error correction decoding. The error correction circuitry 138 may use a parity bit, which has been generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. The error correction circuitry 138 shown in FIG. 2 can include at least some of components included in the controller 130.

For example, the ECC decoder may perform hard decision decoding or soft decision decoding on data transmitted from the memory device 150. The hard decision decoding can be understood as one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 150 by two or more quantized values (e.g., multiple bit data, approximate values, an analog value, and the like) in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. The hard decision decoding in which a value output from a non-volatile memory cell is decoded as 0 or 1. Compared to the hard decision decoding, the soft decision decoding can determine the value stored in the non-volatile memory cell based on the stochastic information. Regarding bit-flipping which may be considered an error that can occur in the memory device 150, the soft decision decoding may provide improved probability of correcting the error and recovering data, as well as providing reliability and stability of corrected data. The LDPC-GM code may have a scheme in which internal LDGM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code (for example, a Hamming code) in two or three dimensions and repeat decoding in a row direction and a column direction to improve reliability of values.

The power management unit (PMU) 140 may control electrical power provided to the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. In a case when the memory device 150 is a flash memory, the memory interface 142 may generate a control signal for the memory device 150 and may process data input to, or output from, the memory device 150 under the control of the processor 134.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102. In addition, the controller 130 may temporarily store write data input from the host 102 in the memory 144 before programming the write data in the memory device 150. When the controller 130 controls operations, such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information (e.g., map data, read requests, program requests, etc.) used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Background operations may be performed without a command transmitted from the host 102. For example, the controller 130 can perform garbage collection (GC), wear leveling (WL), bad block management for identifying and processing bad blocks, or the like.

According to an embodiment, substantially similar operations may be performed as both the foreground operation and the background operation. For example, when the memory system 110 performs garbage collection in response to a request or a command input from the host 102 (e.g., Manual GC), the garbage collection can be considered a foreground operation. When the memory system 110 performs garbage collection independently of the host 102 (e.g., Auto GC), the garbage collection can be considered a background operation.

When the memory device 150 includes a plurality of dies (or a plurality of chips) each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

Referring to FIG. 1, the memory device 150 in the memory system 110 may include a plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together.

In an embodiment, each memory block 152, 154, or 156 may have a three-dimensional stack structure for high integration. Further, the memory device 150 may include a plurality of dies, each die including a plurality of planes, each plane including the plurality of memory blocks 152, 154, 156. A configuration of the memory device 150 may be changed depending on performance of the memory system 110.

FIG. 1 illustrates the memory device 150 that includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data (e.g., two or more bits of data). The MLC memory block may have larger storage capacity for the same space compared to the SLC memory block. The MLC memory block can be highly integrated in view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use a MLC memory block included in the memory device 150 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may require a high data input/output speed for improving performance of the memory system 110.

Further, according to an embodiment, the controller 130 can program data in an MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For a MLC overwrite operation, the controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored 1-bit data.

In an embodiment, the memory device 150 is embodied as a non-volatile memory such as a flash memory, for example, a NAND flash memory, a NOR flash memory, or the like. In another embodiment, the memory device 150 may be implemented by at least one of a phase change random access memory (PCRAM), a ferroelectrics random access memory (FRAM), a spin transfer torque random access memory (STT-RAM), and a spin transfer torque magnetic random access memory (STT-MRAM), or the like.

FIG. 2 illustrates a memory system according to an embodiment of the present disclosure. Specifically, FIG. 2 schematically illustrates a memory cell array circuit of a memory die included in a memory device according to an embodiment of the present disclosure.

Referring to FIG. 2, a memory die can include a memory group 330 including a plurality of non-volatile memory cells. The memory group 330 can include a plurality of cell strings 340. The cell string 340 includes plural non-volatile memory cells connected to each of plural bit lines BL0 to BLm-1. The cell string 340 disposed in each column of the memory group 330 can include at least one drain select transistor DST and at least one string select transistor (or source select transistor) SST. A plurality of non-volatile memory cells or memory cell transistors MC0 to MCn-1 may be connected in series between the drain and string select transistors DST, SST. For example, each of the non-volatile memory cells MC0 to MCn-1 may be configured as a multi-level cell (MLC) that stores a data item having plural bits per cell. The cell strings 340 may be electrically connected to the corresponding bit lines BL0 to BLm-1, individually.

FIG. 2 shows the memory group 330 including NAND-type flash memory cells as an example. However, the memory group 330 included in a memory device 150 according to an embodiment of the present disclosure may not be limited to the NAND-type flash memory. In another embodiment, the memory group 330 can also be implemented as a NOR-type flash memory, a hybrid flash memory in which at least two different types of memory cells are mixed or combined, or a one-chip NAND flash memory in which a controller is embedded in a single memory chip. In addition, the memory group 330 according to an embodiment of the present disclosure can include a flash memory cell in which a charge trap flash (CTF) layer including a conductive floating gate or insulating layer is included.

According to an embodiment of the present disclosure, the memory group 330 shown in FIG. 2 may include at least one memory block 152, 154, 156 included in the memory device 150 shown in FIG. 2. According to an embodiment, the memory device 150 can have a two-dimensional (2D) or three-dimensional (3D) structure. For example, each of the memory blocks 152, 154, 156 in the memory device 150 may be implemented as a 3D structure (or a vertical structure). Each of the memory blocks 152, 154, 156 may have a three-dimensional structure extending along first to third directions, for example, an x-axis direction, a y-axis direction, and a z-axis direction.

The memory group 330 constituting the plurality of memory blocks 152, 154, 156 of the memory device 150 can be coupled to a plurality of bit lines BL, a plurality of string select lines SSL, and a plurality of drain select lines DSL, a plurality of word lines WL, a plurality of dummy word lines DWL (not shown), and a plurality of common source lines CSL. The memory group 300 can include a plurality of NAND strings NS, each NAND string NS including a plurality of memory cells MC. In the memory group 330, each NAND string NS may be connected to each bit line BL. In addition, the string select transistor SST of each NAND string NS may be connected to a common source line CSL, and the drain select transistor DST of each NAND string NS can be connected to a corresponding bit line BL. Here, the memory cells MC may be arranged between the string select transistor SST and the drain select transistor DST of each NAND string NS.

Referring to FIG. 2, the voltage supply circuit 170 in the memory device 150 can supply a word line voltage (e.g., a subject voltage such as a program voltage, a read voltage, and a pass voltage) via each word line according to an operation mode, or supply a voltage to a bulk (e.g., a well region) in which each memory block including the memory cells MC are formed. In this case, a voltage generating operation of the voltage supply circuit 170 may be performed under a control of a control circuit (not shown). Also, the voltage supply circuit 170 may generate a plurality of variable read voltages to distinguish a plurality of data items from each other. In response to the control of the control circuit, one of the memory blocks (or sectors) of the memory cell array may be selected, and one of the word lines of the selected memory block may be selected. Word line voltages may be supplied to the selected word line and the unselected word line, individually. The voltage supply circuit 170 may include a voltage generation circuit for generating target voltages having various levels. The voltage supply circuit 170 may be coupled to a first pin or pad receiving a first power voltage VCC applied from the outside (e.g., an external device) and a second pin or pad receiving the second power voltage VPP applied from the external device. Here, the second power voltage VPP may have a voltage level twice or more higher than that of the first power voltage VCC. For example, the first power voltage VCC may have a voltage level of 2.0V to 5.5V, while the second power supply voltage may have a voltage level of 9V to 13V. The voltage supply circuit 170 according to an embodiment of the present disclosure can include a voltage generation circuit for more rapidly generating the target voltages of various levels used in the memory group 330. The voltage generation circuit can use the second power supply voltage VPP to generate a target voltage which has a higher voltage level than the second power voltage VPP.

A read/write circuit 320 controlled by the control circuit of the memory device 150 may operate as a sense amplifier or a write driver according to an operation mode. For example, in a verification operation and a read operation, the read/write circuit 320 may operate as a sense amplifier for reading the data item from the memory cell array. Also, in a program operation, the read/write circuit 320 may operate as a write driver that controls potentials of bit lines according to a data item to be stored in the memory cell array. The read/write circuit 320 may receive the data item to be programmed to the cell array from page buffers (not shown) during the program operation. The read/write circuit 320 can drive bit lines based on the input data item. To this end, the read/write circuit 320 includes a plurality of page buffers (PB) 322, 324, 326, each page buffer corresponding to each column (or each bit line) or each column pair (or each bit line pair). According to an embodiment, a plurality of latches (not shown) may be included in each of the page buffers 322, 324, 326.

Although not shown, the page buffers 322, 324, 326 may be coupled to a data input/output device (e.g., a serialization circuit or a serializer) through a plurality of buses BUS.

When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without any waiting time.

According to an embodiment, the memory device 150 may receive a write command, write data, and information (e.g., a physical address) regarding a location in which the write data is to be stored. Control circuitry 180 causes the voltage supply circuit 170 to generate a program pulse, a pass voltage, etc. used for a program operation performed in response to a write command, and generates various voltages used for a verification operation performed after the program operation.

Figure 3:
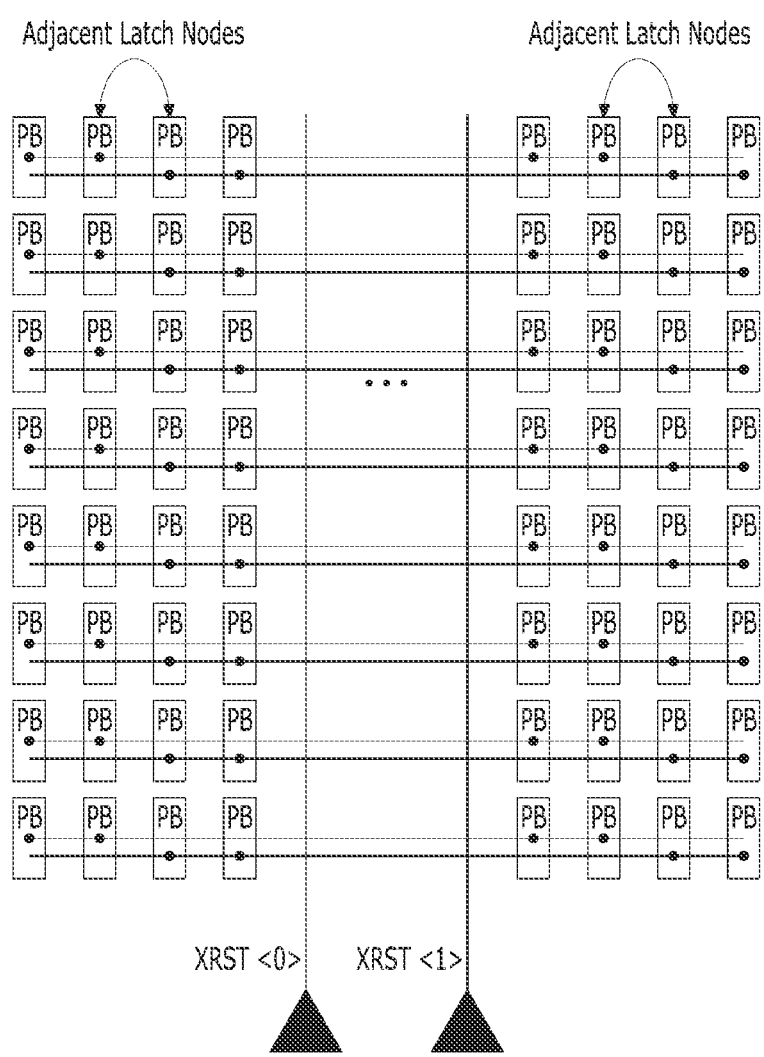
FIG. 3 illustrates a first example of a page buffer and a control signal in the memory device according to an embodiment of the present disclosure.

FIG. 3 illustrates a first example of a page buffer and a control signal in the memory device according to an embodiment of the present disclosure. Specifically, FIG. 3 illustrates an example of the page buffers (PB) 322, 324, 326 included in the read/write circuit 320 in the memory device 150 shown in FIG. 2.

Referring to FIG. 3, a plurality of page buffers PB in the read/write circuit 320 may be disposed adjacent to each other in row and column directions. According to an embodiment, the plurality of page buffers PB may be arranged in a three-dimensional structure. Here, the page buffer PB may correspond to the page buffers 322, 324, 326 described with reference to FIG. 2.

Referring to FIGS. 2 and 3, the page buffer PB may receive data stored in a non-volatile memory cell through a bit line and temporarily store the data. The page buffer PB includes at least one latch. After transferring data to a component, a latch temporarily storing data might be reset to store new data. The control circuitry 180 shown in FIG. 2 can transmit control signals XRST<0>, XRST<1> for resetting the page buffer PB. In response to the control signals XRST<0>, XRST<1>, a latch included in the page buffer PB can be initialized. The control signals XRST<0>, XRST<1> described in FIG. 3 can correspond to reset signals MRST, DRST, SRST applied to a latch shown in FIG. 8.

The two sequential control signals XRST<0>, XRST<1> described in FIG. 3 are not applied to neighboring page buffers PB which are disposed adjacent to each other. In a case when the control circuitry 180 sequentially activates the two sequential control signals XRST<0>, XRST<1> or when activation sections of the two sequential control signals XRST<0>, XRST<1> are overlapped at least in part with each other, interference may occur between the neighboring page buffers PB. Accordingly, the two sequential control signals XRST<0>, XRST<1> can be applied to page buffers PB disposed apart from each other by a preset distance. When the two sequential control signals XRST<0>, XRST<1> are applied to page buffers PB arranged apart from each other by a preset distance, data distortion due to interference could be avoided even if the activation sections of the two sequential control signals XRST<0>, XRST<1> are overlapped at least in part with each other, because the page buffers PB are spaced apart from each other by a preset distance.

Figure 4:
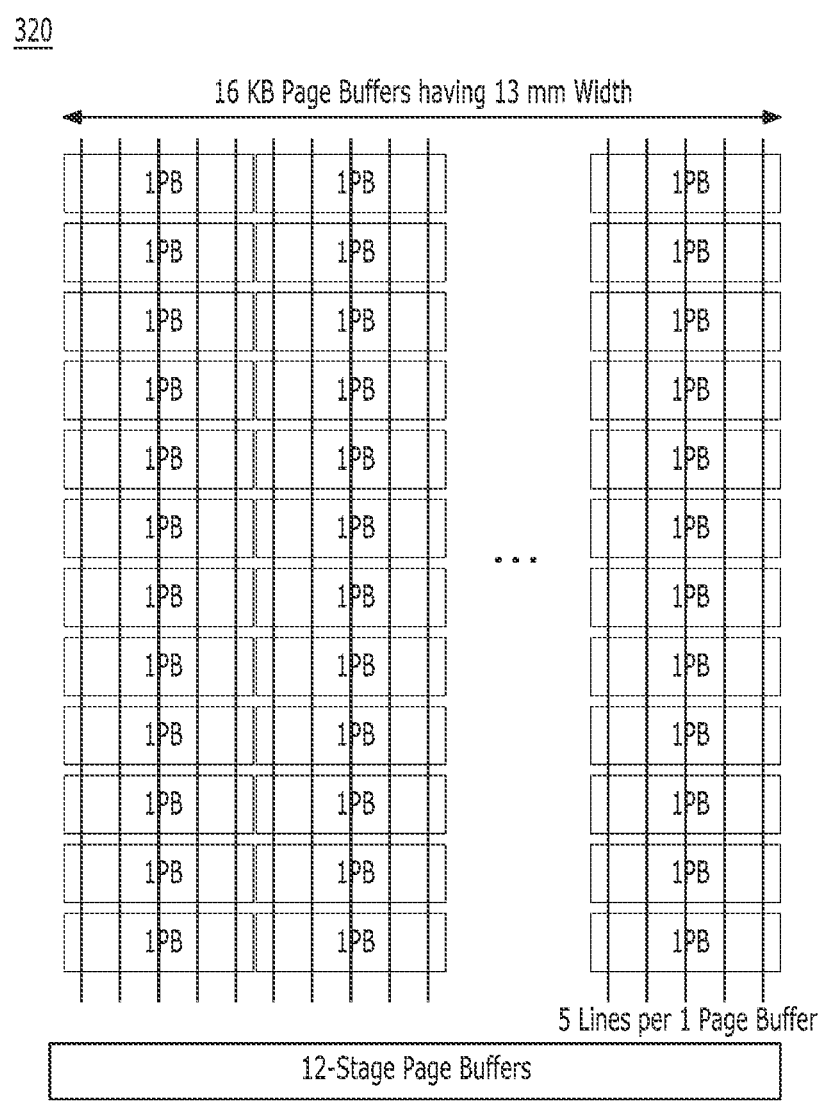
FIG. 4 illustrates a first structure of a page buffer circuit in the memory device according to an embodiment of the present disclosure.
Figure 5:
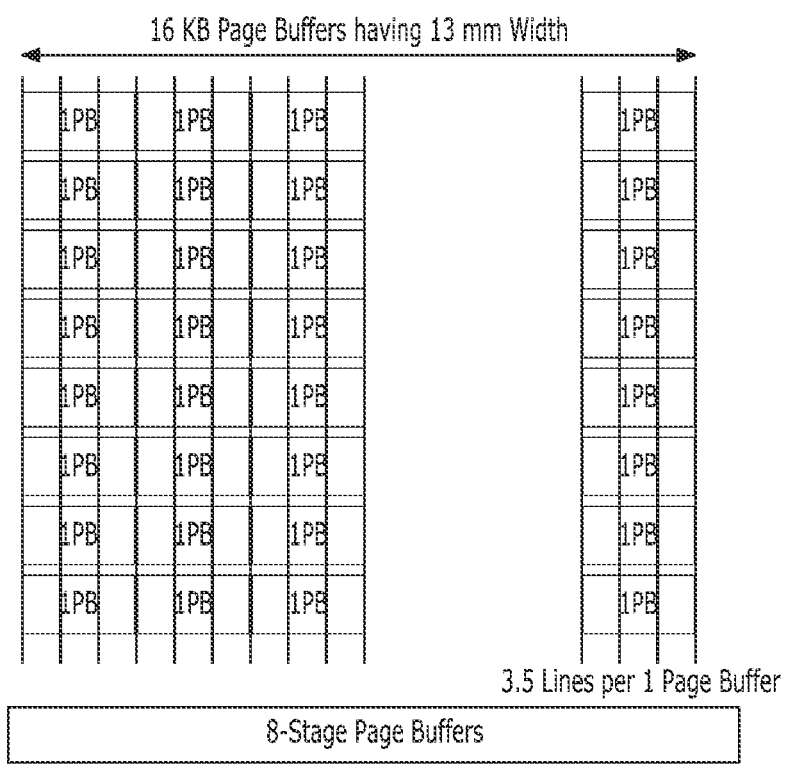
FIG. 5 illustrates a second structure of a page buffer circuit in the memory device according to an embodiment of the present disclosure.

Hereinafter, an example in which the memory device 150 has a shielded bit line structure (Shielded BL Architecture) is described with reference to FIGS. 4 to 5. The page buffer PB can be understood as a sensing and latching circuit. Referring to FIG. 2, the memory device 150 can have a structure (All BL Architecture) in which one page buffer 322 can be connected to one bit line BL. Referring to FIGS. 4 to 5, the shielded bit line architecture in which one page buffer PB is connected to two or more bit lines BL will be described.

For example, non-volatile memory cells included in the memory group 330 included in the memory device 150 can read or store data having 16 k bytes at a time. The read/write circuit 320 can include a number of sensing and latching devices corresponding to data of 16 k bytes. For example, a plurality of sensing and latching devices included in the read/write circuit 320 can be arranged adjacent to each other in rows (horizontal stages) and columns (longitudinal stages). Likewise, the plurality of sensing and latching devices included in the read/write circuit 320 can be arranged adjacent to each other in rows (horizontal stages) and columns (longitudinal stages). However, the number of stages of the page buffers PB included in the read/write circuit 320 in the memory device 150 can be differently designed to improve or enhance an integration degree of the memory device 150 (e.g., to reduce a size of the memory device 150 even having the same storage capacity).

For example, as the number of stages of the sensing and latching devices in a longitudinal direction parallel to the bit line increases, the integration degree of the memory device 150 may decrease. Referring to FIG. 2, as the number of stages of the sensing and latching devices decreases in the longitudinal direction parallel to the bit line, a greater number of page buffers 322, 324, 326 in the read/write circuit 320 could be arranged in a horizontal direction that intersects the bit lines BL0, BL1, . . . , BLm-1. As the number of stages of sensing and latching devices in the longitudinal direction parallel to the bit line BL0, BL1, . . . , BLm-1 increases, a lesser number of page buffers 322, 324, 326 in the read/write circuit 320 could be arranged in the longitudinal direction parallel to the bit lines BL0, BL1, . . . , BLm-1.

FIG. 4 illustrates a first structure of a page buffer circuit in the memory device according to an embodiment of the present disclosure. Referring to FIG. 4, the plurality of page buffers PB in the read/write circuit 320 can be arranged for non-volatile memory cells storing data of 16 k Byte in 12 stages within a 13 mm width. Five lines may be disposed in each page buffer PB. That is, each page buffer PB can be designed and formed to have a size corresponding to at least five lines.

FIG. 5 illustrates a second structure of a page buffer circuit in the memory device. Referring to FIG. 5, the plurality of page buffers PB in the read/write circuit 320 can be arranged for non-volatile memory cells storing data of 16 k Byte in 8 stages within a width of 13 mm. 3.5 lines may be disposed in each page buffer PB.

Referring to FIGS. 4 and 5, the same number of sensing and latching devices can be disposed in different numbers of stages within a same area (e.g., 13 mm in width). Five lines can be disposed on the page buffer PB in a first structure described with reference to FIG. 4, whereas 3.5 lines can be disposed on the page buffer PB in a second structure described with reference to FIG. 5. Because each line can be implemented with a minimum width in a semiconductor substrate by a semiconductor device manufacturing process, an integration degree of the read/write circuit 320 having the second structure can be higher than that of the first structure.

Figure 6:
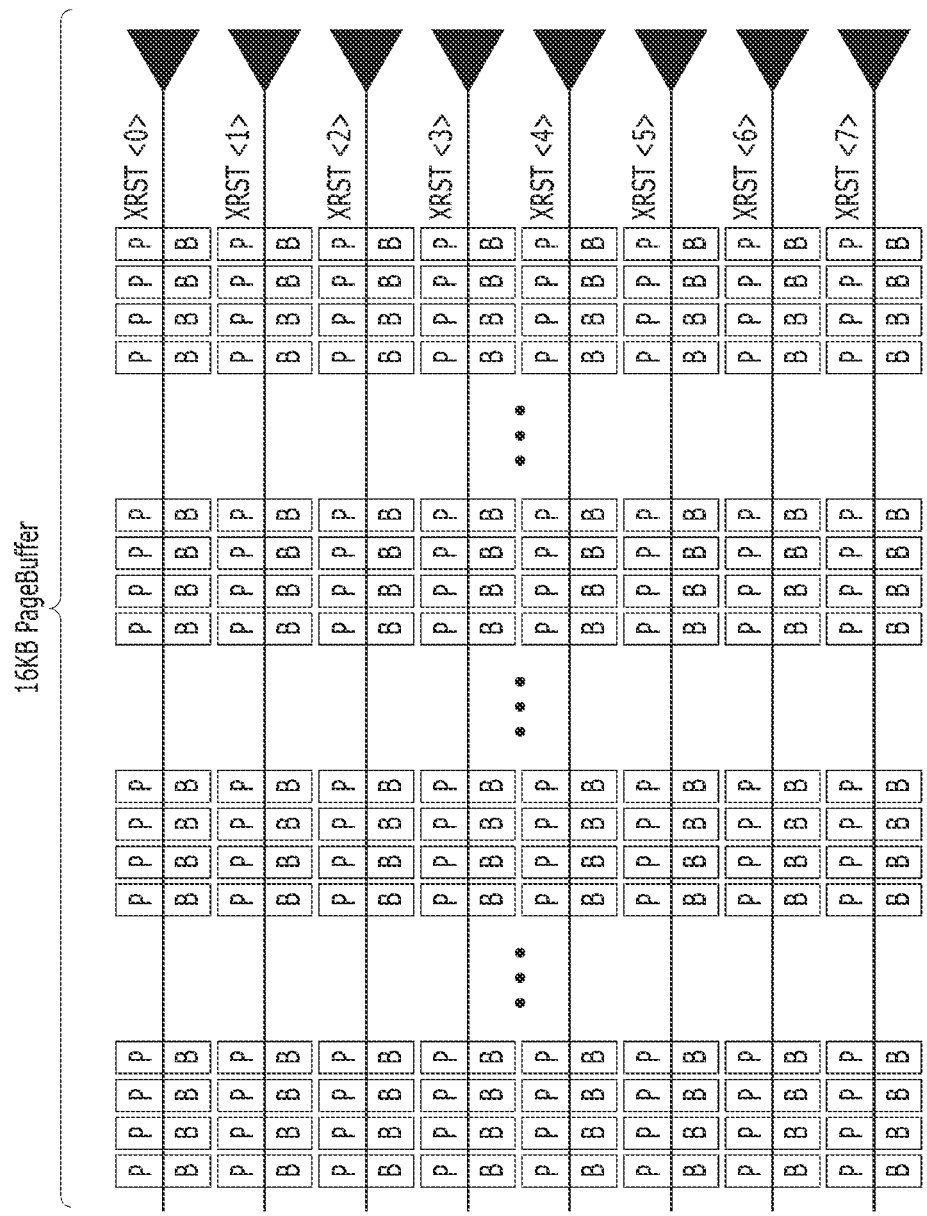
FIG. 6 illustrates a second example of the page buffer and the control signal in the memory device according to an embodiment of the present disclosure.

FIG. 6 illustrates a second example of the page buffer and the control signal in the memory device according to an embodiment of the present disclosure.

Referring to FIG. 6, wires or lines through which control signals XRST<0:7> are applied for the plurality of page buffers PB included in the read/write circuit 320 can be arranged in a horizontal direction. The control signals XRST<0:7> associated with the plurality of page buffers PB are applied separately for each stage of the page buffer PB. Each stage of the page buffers PB can be controlled by each control signal. Eight control signals XRST<0:7> can be respectively applied to eight stages of the page buffers PB described with reference to FIG. 5.

Figure 7:
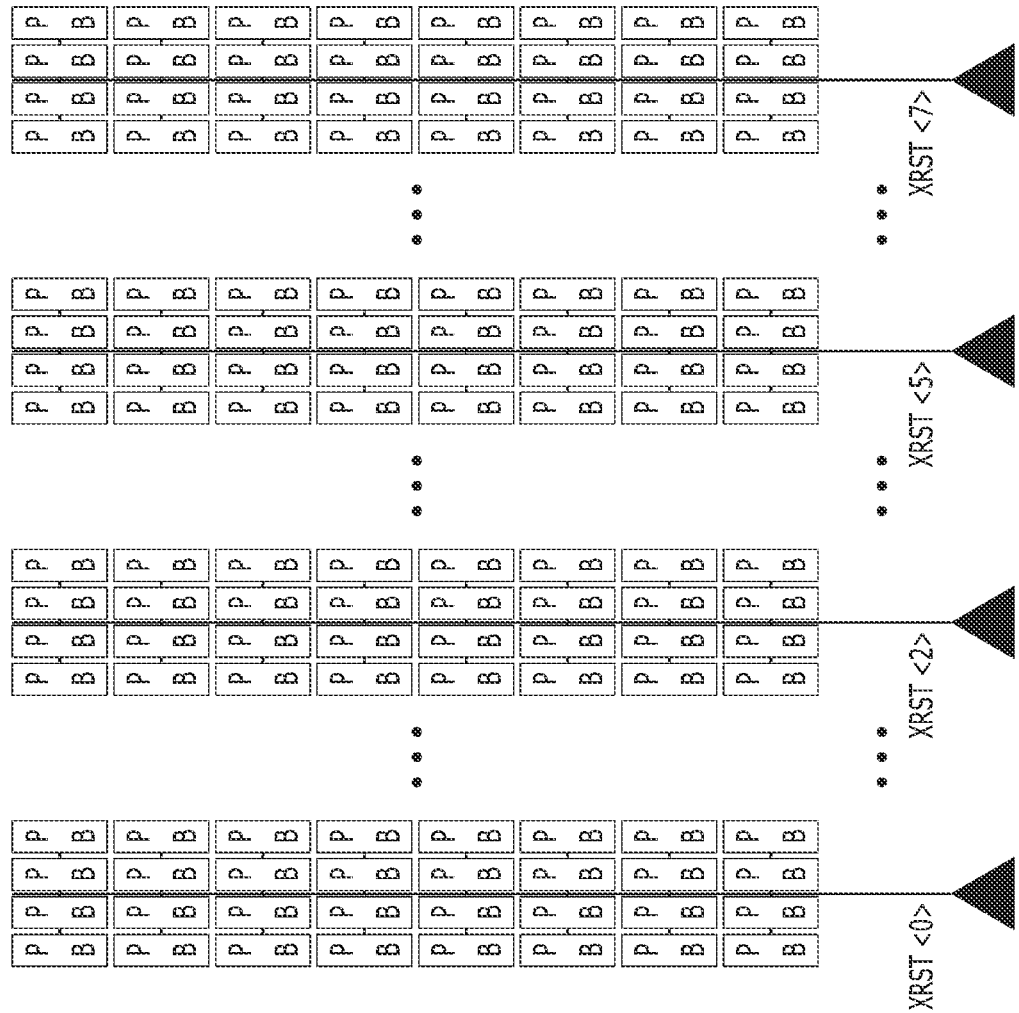
FIG. 7 illustrates a third example of the page buffer and the control signal in the memory device according to an embodiment of the present disclosure.

FIG. 7 illustrates a third example of the page buffer and the control signal in the memory device according to an embodiment of the present disclosure.

Referring to FIG. 7, wires to which control signals XRST<0:7> for a plurality of page buffers PB in the read/write circuit 320 are applied may be arranged in a vertical direction. The control signals XRST<0:7> for the plurality of page buffers PB have a structure in which they are applied separately for each zone of the page buffer PB. can be controlled. Eight control signals XRST<0:7> may be applied to the page buffer PB arranged in the eight zones described with reference to FIG. 5.

Referring to FIGS. 6 and 7, the plurality of control signals XRST<0:7> applied to the plurality of page buffers PB can be applied along wirings disposed or arranged in either a horizontal (row) direction (e.g., a direction crossing a bit line) or a longitudinal (column) direction (e.g., a direction parallel to the bit line).

Figure 8:
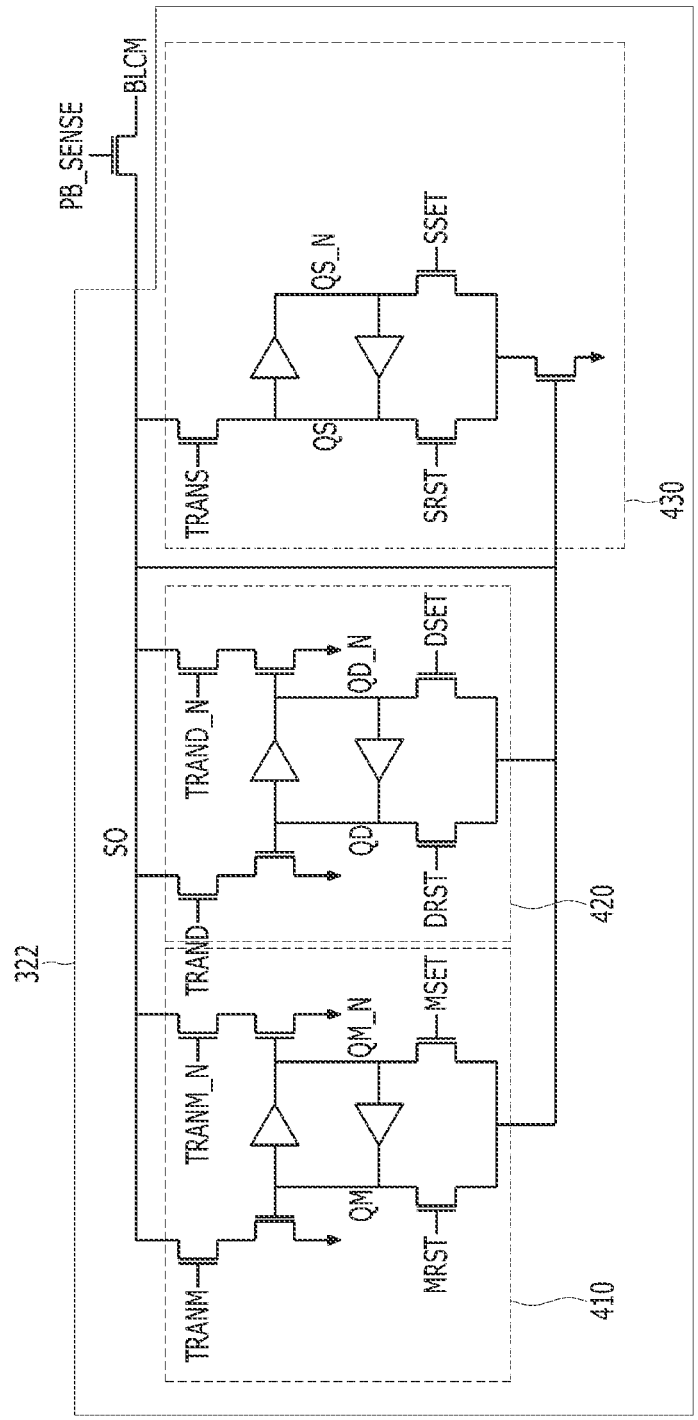
FIG. 8 illustrates a page buffer included in the memory device according to an embodiment of the present disclosure.

FIG. 8 illustrates a page buffer included in the memory device according to an embodiment of the present disclosure. FIG. 8 illustrates an internal configuration regarding page buffers PB having either the all bit line structure (All BL Architecture) or the shielded bit line structure (Shielded BL Architecture).

Referring to FIGS. 2 and 8, the page buffer 322 can be coupled to the bit line (BL) BLCM through a switching element. The switching element may be controlled by a page buffer control signal PB_SENSE. When the switching element is turned on by the page buffer control signal PB_SENSE, the bit lines (BL) BLCM can be connected to the page buffer 322. When the switching element is turned off by the page buffer control signal PB_SENSE, the bit lines (BL) BLCM and the page buffer 322 can be electrically cut off.

According to an embodiment, the page buffer 322 can include a main register 430, a first sub-register 410, and a second sub-register 420. Each of the main register 430, the first sub-register 410, and the second sub-register 420 can include an inverter latch. Each of the main register 430, the first sub-register 410, and the second sub-register 420 can be connected to a sensing node SO by the control signals TRANM, TRAND, TRANS. The inverter latch included in the main register 430 can include two nodes QS, QS_N at which potentials corresponding to opposite values are maintained. The inverter latch included in the first sub-register 410 can include two nodes QM, QM_N at which potentials corresponding to opposite values are maintained. The inverter latch included in the second sub-register 420 can include two nodes QD, QD_N at which potentials corresponding to opposite values are maintained. In addition, the inverter latches included in each of the main register 430, the first sub-register 410, and the second sub-register 420 can store values initialized by the reset signals MRST, DRST, SRST.

The page buffer 322 connected to the bit line BLCM may be controlled for a program operation, a verification operation, or a read operation. For example, when it is recognized through the verification operation performed based on a sub-verification voltage that a threshold voltage of a non-volatile memory cell is greater than the sub-verification voltage, a first positive voltage having a lower voltage level than a program inhibit voltage could be applicable to the bit line BLCM according to data stored in the first sub-register 410 during a first program operation after the verification operation. The second sub-register 420 could be set to apply a second positive voltage having a higher voltage level than the first positive voltage to the bit line BLCM during a second program operation following the first program operation, according to data transferred through the first sub-register 410.

The main register 430 could be set to discharge the bit line BLCM according to stored data before the first or second positive voltage is applied to the bit line BLCM when the threshold voltage of the memory cell is less than a target verification voltage. The main register 430 could be set to apply a program inhibit voltage to the bit line BLCM according to stored data before the first or second positive voltage is applied to the bit line BLCM when the threshold voltage of the memory cell is equal to or greater than the target verification voltage.

In an embodiment, while the second sub-register 420 is used for applying the second positive voltage to the bit line BLCM, the first sub-register 410 can be also used for applying the first positive voltage to the bit line BLCM. This method can increase drivability, thereby reducing a time taken to precharge the bit line BLCM for the program operation.

The page buffer (PB) 322 including two sub-registers 410, 420 is described in FIG. 8. When the page buffer 322 includes two sub-resistors 410, 420, two positive voltages having different voltage levels (e.g., the first and second positive voltages) could be applied to the bit line BLCM. This operation method could have the same effect as a level of a step pulse programming in which voltage is reduced during the program operation. According to an embodiment, when the page buffer (PB) 322 includes three sub-registers, three different positive voltages could be applied to the bit line BLCM so that a degree of programming in a non-volatile memory cell could be controlled more precisely.

Figure 9:
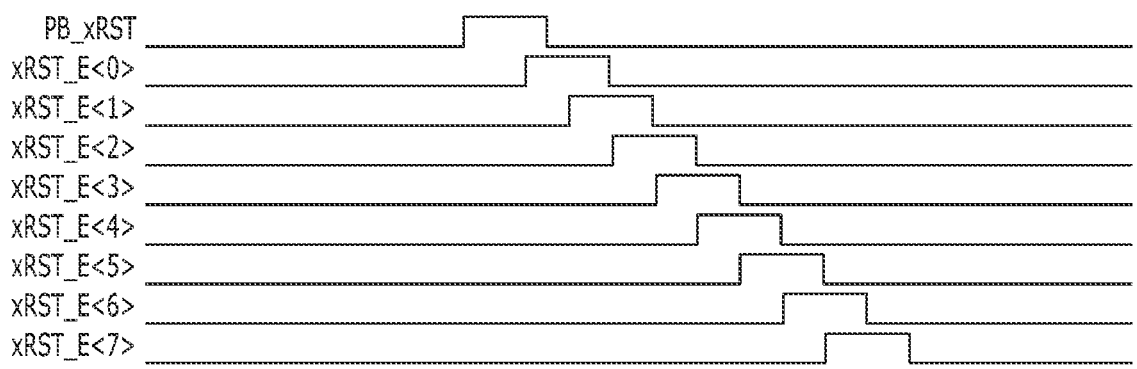
FIG. 9 illustrates a first operation method for controlling the page buffer included in the memory device.

FIG. 9 illustrates a first operation method for controlling the page buffer included in the memory device.

Referring to FIGS. 2 and 9, the control circuitry 180 can output the page buffer reset signal PB_xRST to the read/write circuit 320. The read/write circuit 320 can split the page buffer reset signal PB_xRST into a plurality of control signals xRST_E<0:7>. The read/write circuit 320 can further include a splitter capable of dividing the page buffer reset signal PB_xRST into the plurality of control signals xRST_E<0:7>.

According to an embodiment, the control circuitry 180 may output the plurality of control signals xRST_E<0:7> to the read/write circuit 320.

Referring to FIG. 9, the plurality of control signals xRST_E<0:7> applied to a plurality of page buffers PB can be sequentially activated. Referring to FIGS. 6 and 7, the plurality of control signals xRST_E<0:7> can be applied to each stage or zone of the plurality of page buffers PB. Activation sections of neighboring control signals, e.g., xRST_E<0>, xRST_E<1>, which are applied to neighboring stages or zones of the plurality of page buffers PB can be partially overlapped with each other.

Figure 10:
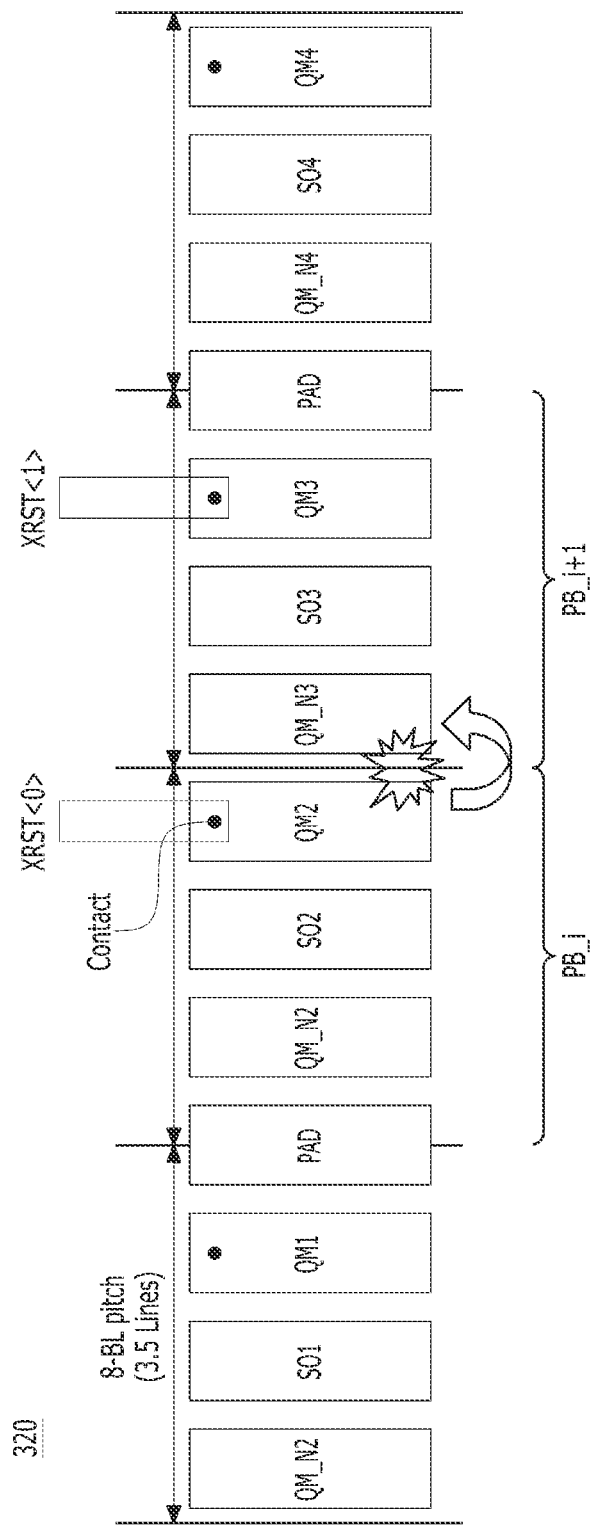
FIG. 10 illustrates interference occurring when the memory device operates through the first operation method.

FIG. 10 illustrates interference occurring when the memory device operates through the first operation method. Referring to FIG. 5, like the plurality of page buffers PB in the read/write circuit 320, 3.5 lines can be arranged in each of first and second page buffers PB_i, PB_i+1.

Referring to FIG. 10, values stored in nodes QM2, QM3 of latches included in the first and second page buffers PB_-i, PB_i+1 could be individually reset or initialized when the first and second control signals XRST<0>, XRST<1> are applied to the first and second page buffers PB_i, PB_i+1. Because the first control signal XRST<0> is not electrically connected to another node QM_N3 of the latch in the second page buffer PB_i+1 which is adjacent to the first page buffer PB_i, it is preferable that the first control signal XRST<0> would not affect the latch corresponding to the node QM_N3 in the second page buffer PB_i+1. However, an integration degree of the memory device 150 is very high. Neighboring latches, i.e., adjacently located latches, included in the two neighboring page buffers PB_i, PB_i+1 or the nodes QM2, QM_N3 included in the neighboring latches may affect each other. Due to the first control signal XRST<0>, interference may occur between two adjacent page buffers PB_i, PB_i+1.

The node QM3 included in the latch included in the second page buffer PB_i+1 can be initialized by the second control signal XRST<1>. However, a potential of the sensing node SO3 in the second page buffer PB_i+1 can be influenced by the first control signal XRST<0>. Also, the activation sections of the first control signal XRST<0> and the second control signal XRST<1> are partially overlapped with each other. Interference can occur in the second page buffer PB_i+1 by the first control signal XRST<0> applied to the first page buffer PB_i. Due to the second control signal XRST<1> applied to the second page buffer PB_i+1, interference can occur in the first page buffer PB_i.

Figure 11:
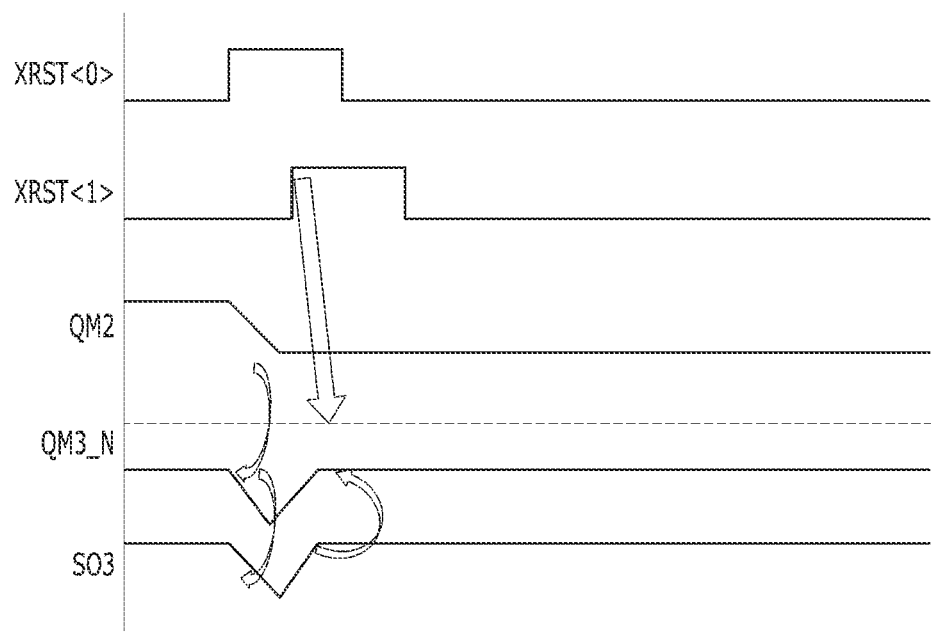
FIG. 11 illustrates data distortion due to the interference shown in FIG. 10.

FIG. 11 illustrates data distortion due to the interference shown in FIG. 10.

Referring to FIGS. 10 and 11, interference occurs when the first and second control signals XRST<0>, XRST<1> having at least partially overlapped activation periods are applied to the neighboring page buffers PB_i, PB_i+1.

When the first control signal XRST<0> is activated, a potential of the node QM2 of the latch included in the first page buffer PB_i may be lowered to a logic low level (e.g., a ground voltage). As the potential of the node QM2 of the latch included in the first page buffer PB_i decreases, a potential of the node QM3_N of the latch included in the second page buffer PB_i+1 fluctuates to a logic low level (e.g., a ground voltage). As the potential of the node QM3_N of the latch included in the second page buffer PB_i+1 decreases, a potential of the sensing node SO3 included in the second page buffer PB_i+1 fluctuates to a logic low level (e.g., a ground voltage).

Referring to FIG. 11, when the second control signal XRST<1> is activated, the potential of the node QM3_N of the latch included in the second page buffer PB_i+1 becomes a logic high level (e.g., a power supply voltage indicated by the dotted line). However, as described above, as the potential of the sensing node SO3 is lowered to a logic low level (e.g., a ground voltage), the potential of the node QM3_N of the latch included in the second page buffer PB_i+1 could rise due to interference. For this reason, the latch included in the second page buffer PB_i+1 might not be initialized in response to the second control signal XRST<1>. That is, the potential of the node QM3_N of the latch included in the second page buffer PB_i+1 might not rise to a logic high level (e.g., the power supply voltage indicated by the clotted line). Referring to FIG. 8, the potential of another node QM3 of the latch included in the second page buffer PB_i+1 may also be fluctuated, so that the latch included in the second page buffer PB i+1 might not be initialized or reset.

Figure 12:
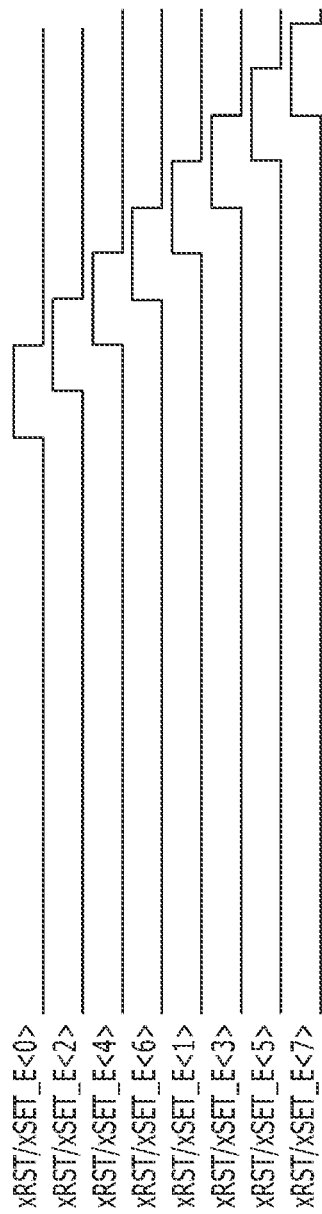
FIG. 12 illustrates a second operation method for controlling the page buffer included in the memory device according to an embodiment of the present disclosure.

FIG. 12 illustrates a second operation method for controlling the page buffer included in the memory device according to an embodiment of the present disclosure.

Referring to FIG. 12, activation sections of adjacent control signals among the plurality of control signals xRST<0:7>, xSET_E<0:7> applied to the plurality of page buffers PB may be separated from each other by a preset time. For example, when adjacent control signals xRST<0>, xRST<1> applied to two adjacent page buffers PB_i, PB_i+1 disposed between adjacent insulating pads or insulating structures PAD (see FIGS. 10 and 13), the activation sections of the first control signal xRST<0> and the second control signal xRST<1> may be separated from each other by a time corresponding to at least one of the activation sections of the first and second control signals xRST<0>, xRST<1>. Activation sections of two other neighboring control signals (e.g., third and fourth control signals xRST<2>, xRST<3>) may also be spaced apart from each other by a time corresponding to at least one of the activation sections of the third and fourth control signals xRST<2>, xRST<3>. Further, activation sections of two other neighboring control signals (e.g., fifth and sixth control signals xRST<4>, xRST<5>) may also be separated from each other by a time corresponding to at least one of the activation sections of the fifth and sixth control signals xRST<4>, xRST<5>. Likewise, two other adjacent control signals (e.g., seventh and eighth control signals xRST<6>, xRST<7>) can have activation sections which are spaced apart from each other by a time corresponding to at least one of the activation sections of the seventh and eighth control signals xRST<6>, xRST<7>.

Referring to FIGS. 9 and 12, the activation sections of the eight control signals xRST<0:7> is substantially the same with each other. Accordingly, operation margins of the plurality of page buffers according to the eight control signals xRST<0:7> may be substantially the same with each other. Data input/output speed of the memory device 150 might not be reduced. However, the first and second control signals xRST<0>, xRST<1> among the eight control signals xRST<0:7> are applied to the first and second page buffers PB_i, PB_i+1 disposed between adjacent insulating pads. Herein, the activation sections of the first and second control signals xRST<0>, xRST<1> might not overlap with each other. The activation sections of the first and second control signals xRST<0>, xRST<1> can be spaced apart from each other.

Figure 13:
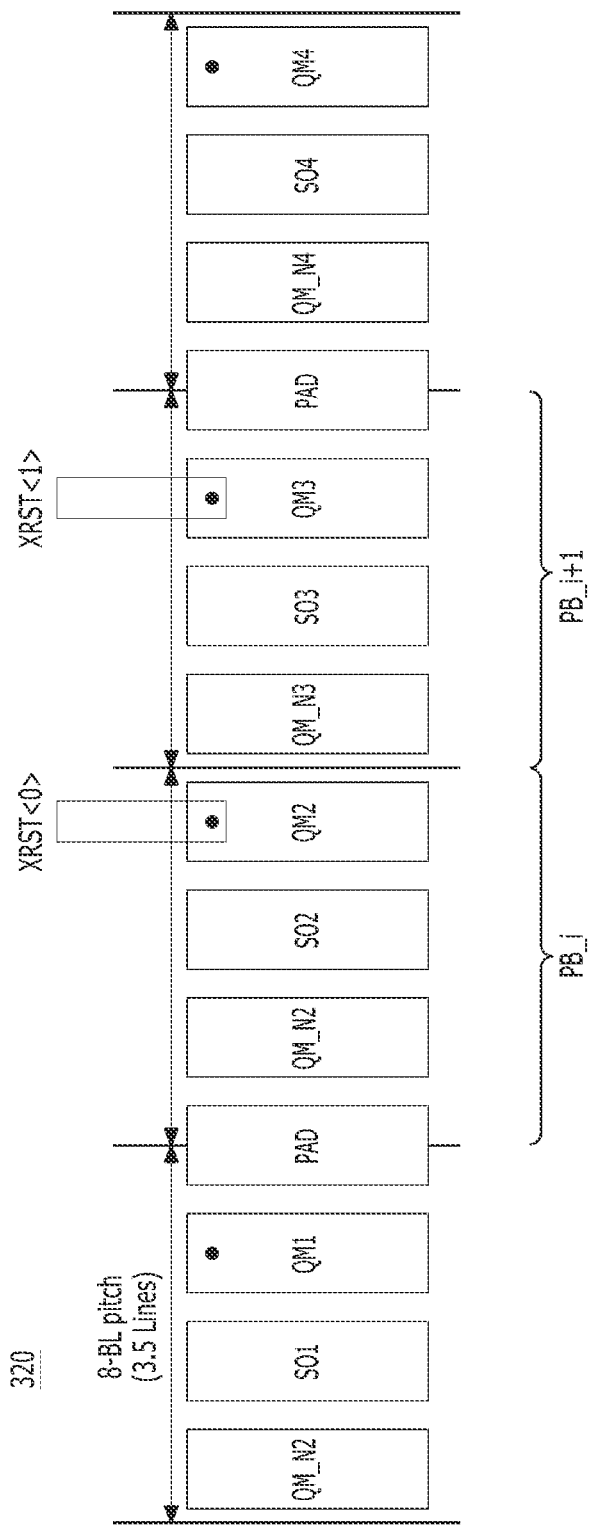
FIG. 13 illustrates how to avoid interference occurring when the memory device operates through the second operation method according to an embodiment of the present disclosure.

FIG. 13 illustrates how to avoid interference occurring when the memory device operates through the second operation method according to an embodiment of the present disclosure. Referring to FIGS. 5 and 10, like the plurality of page buffers PB in the read/write circuit 320, 3.5 lines may be arranged in each of the first and second page buffers PB_i, PB_i+1.

Referring to FIG. 13, values stored in nodes QM2, QM3 of latches included in the first and second page buffers PB_i, PB_i+1 could be individually reset or initialized when the first and second control signals XRST<0>, XRST<1> are applied to the first and second page buffers PB_i+1. Because the first control signal XRST<0> is not electrically connected to another node QM_N3 of the latch in the second page buffer PB_i+1 which is adjacent to the first page buffer PB_i, it is preferable that the first control signal XRST<0> would not affect the latch corresponding to the node QM_N3 in the second page buffer PB_i+1. However, an integration degree of the memory device 150 is very high. Neighboring latches, i.e., adjacently located latches, included in the two neighboring page buffers PB_i, PB_i+1 or the nodes QM2, QM_N3 included in the neighboring latches may affect each other. Due to the first control signal XRST<0>, interference may occur between two adjacent page buffers PB_i, PB_i+1.

In the embodiment described with reference to FIG. 13 unlike the embodiment described with reference to FIG. 10, the second control signal XRST<1> is not activated while the first control signal XRST<0> is activated. Even if the latch included in the second page buffer PB_i+1 is affected by interference due to the first control signal XRST<0>, the second control signal XRST<1> can be applied to the second page buffer PB_i+1 after a preset time elapses. The node QM3 included in the latch included in the other page buffer PB_i+1 can be initialized by the second control signal XRST<1>. Even if the potential of the sensing node SO3 in the second page buffer PB_i+1 is affected by interference due to the first control signal XRST<0>, the second control signal XRST<1> can be activated later, so that the second page buffer PB_i+1 may be normally reset or initialized by the second control signal XRST<1>.

Although the activation sections of the eight control signals XRST<0:7> are described as substantially the same with each other in FIG. 13, the activation sections of the eight control signals XRST<0:7> can be different depending on an embodiment. In an embodiment, some of the activation sections may be the same but others may be different to avoid overlap.

Figure 14:
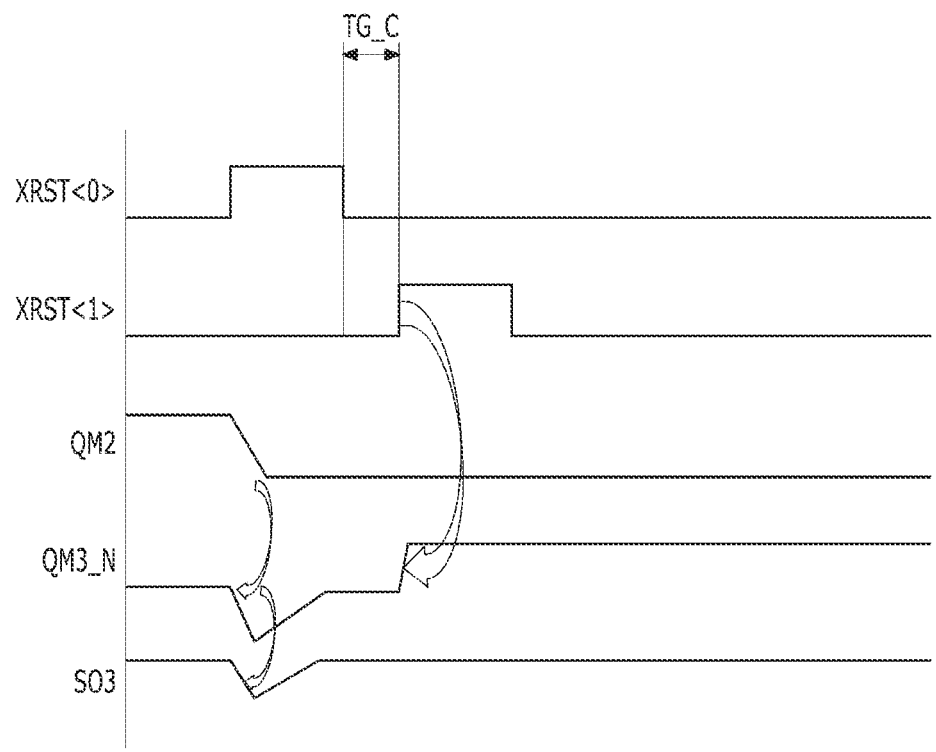
FIG. 14 illustrates how to avoid data distortion according the second operation method according to an embodiment of the present disclosure.

FIG. 14 illustrates how to avoid data distortion according the second operation method according to an embodiment of the present disclosure. Referring to FIGS. 13 and 14, when the first and second control signals XRST<0>, XRST<1> that are spaced apart from each other by an activation period TG_C are individually applied to the first and second page buffers PB_i, PB_i+ which are adjacently located, it is described how to normally initialize or reset the latch in order to avoid data distortion even when interference occurs.

When the first control signal XRST<0> is activated, the potential of the node QM2 of the latch included in the first page buffer PB_i may be lowered to a logic low level (e.g., a ground voltage). As the potential of the node QM2 of the latch included in the first page buffer PB_i decreases, the potential of the node QM3_N of the latch included in the second page buffer PB_i+1 fluctuates to a logic low level (e.g., a ground voltage). As the potential of the node QM3_N of the latch included in the second page buffer PB_i+1 decreases, the potential of the sensing node SO3 included in the second page buffer PB_i+1 fluctuates to a logic low level (e.g., a ground voltage). Due to a high degree of integration, it might be difficult to suppress interference caused between adjacently located latches.

However, while the first control signal XRST<0> is activated, the second control signal XRST<1> is not activated. Referring to FIG. 13, the activation section of the first control signal XRST<0> and the activation section of the second control signal XRST<1> can be spaced apart from each other by a time corresponding to at least one of the activation sections of the first control signal XRST<0> and the second control signal XRST<1>.

Referring to FIG. 14, the potential of the latch node QM3_N included in the second page buffer PB_i+1 may fluctuate due to interference generated when the first control signal XRST<0> is activated and applied to the first page buffer PB_i. After the preset time TG_C has elapsed, the second control signal XRST<1> can be activated. When the second control signal XRST<1> is activated, the potential of the node QM3_N of the latch included in the second page buffer PB_i+1 may rise to a logic high level (e.g., a power supply voltage). Even if the potential is fluctuated due to interference, the potential of the latch node QM3_N included in the second page buffer PB_i+1 could be increased by the second control signal XRST<1>. Accordingly, the latch included in the second page buffer PB_i+1 can be normally initialized in response to the second control signal XRST<1>.

A semiconductor device according to an embodiment of the disclosure can separate signals for avoiding overlap between operation times, margins, or periods of adjacently located circuits having a high integration degree and avoid distortion of signals or data due to interference caused by the adjacently located circuits.

Further, in a memory device in which page buffers, connected to a plurality of non-volatile memory cells, for temporarily storing data for input/output are highly integrated, a control circuit can avoid overlap between activation sections of control signals for activating adjacent page buffers, thereby reducing or avoiding interference.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device, comprising:
   a memory structure including plural page buffers coupled to non-volatile memory cells, each non-volatile memory cell capable of storing data, wherein the plural page buffers are disposed in a predetermined direction; and
   a control circuit configured to separate reset sections of two page buffers from each other by a length of time, the length corresponding to at least one of the reset sections,
   wherein the two page buffers are disposed directly adjacent to each other among the plural page buffers.

2. The memory device according to claim 1, wherein the memory structure comprises:
   a bit line coupling at least one non-volatile memory cell among the non-volatile memory cells to at least one plural page buffer among the plural page buffers; and
   a switching circuit configured to control connection between the bit line and the at least one non-volatile memory cell.

3. The memory device according to claim 2, wherein the page buffer comprises:
   a sensing node coupled to the switching circuit; and
   two latches coupled to the sensing node.

4. The memory device according to claim 3, wherein the control circuit is configured to transfer a control signal for resetting one of the two latches included in the page buffer.

5. The memory device according to claim 1,
   wherein the control circuit separates the reset sections by outputting a first control signal and a second control signal to be applied to the two page buffers, and
   wherein a first activation section of the first control signal and a second activation section of the second control signal are separated from each other by the length of a time corresponding to at least one of the first activation section or the second activation section.

6. The memory device according to claim 5, wherein the first activation section and the second activation section are the same as each other.

7. The memory device according to claim 5, wherein the two page buffers are disposed between neighboring isolation pads formed in a semiconductor substrate.

8. The memory device according to claim 7, wherein at least one of the two page buffers disposed between the neighboring isolation pads and at least one of page buffers disposed outside the neighboring isolation pads have partially overlapped activation sections.

9. The memory device according to claim 1, wherein the page buffer has a width corresponding to 3.5 or 5 lines formed in the semiconductor substrate in a plan view.

10. A semiconductor device, comprising:
a structure including plural buffers disposed in a predetermined direction, each buffer including a latch storing data; and
a control circuit configured to separate respective activation sections of two buffers from each other by a length of time, the length corresponding to at least one of the activation sections,
wherein the two buffers are disposed directly adjacent to each other among the plural buffers.

11. The semiconductor device according to claim 10, wherein the buffer comprises:
a sensing node for receiving or outputting the data; and
two latches coupled to the sensing node.

12. The semiconductor device according to claim 11, wherein the control circuit is configured to transfer a control signal for resetting one of the two latches included in the page buffer.

13. The semiconductor device according to claim 12, wherein the control circuit separates the activation sections by outputting a first control signal and a second control signal to be applied to the two buffers, and
wherein a first activation section of the first control signal and a second activation section of the second control signal are separated from each other by the length of a-time corresponding to at least one of the first activation section or the second activation section.

14. The semiconductor device according to claim 13, wherein the first activation section and the second activation section are the same as each other.

15. The semiconductor device according to claim 13, wherein the two page buffers are disposed between neighboring isolation pads formed in a semiconductor substrate.

16. The semiconductor device according to claim 15, wherein at least one of the two page buffers disposed between the neighboring isolation pads and at least one of page buffers disposed outside the neighboring isolation pads have partially overlapped activation sections.

17. The semiconductor device according to claim 12, wherein the buffer has a width corresponding to 3.5 or 5 lines formed in the semiconductor substrate in a plan view.

18. A method for operating a memory device, comprising:
applying a first control signal having a first activation section to a first page buffer of two page buffers which are disposed directly adjacent to each other among plural page buffers; and
applying a second control signal having a second activation section to a second page buffer of the two page buffers,
wherein the first activation section and the second activation section are separated from each other by a length of time, the length corresponding to at least one of the first activation section or the second activation section.

19. The method according to claim 18, wherein the first and second page buffers are disposed between neighboring isolation pads formed in a semiconductor substrate.

20. The method according to claim 18, wherein the first activation section and the second activation section are the same as each other.

21. A memory device comprising:
a memory cell array of columns;
first and second page buffers disposed physically adjacent to each other and each including first and second latches coupled to a corresponding column, the second latch of the first page buffer being disposed directly adjacent to the first latch of the second page buffer; and
a control circuit configured to apply first and second signals to the respective first latches to reset the first latches,
wherein the first and second signals stay enabled during respective time amounts that are separated by any of the time amounts.

22. The memory device according to claim 1, wherein the two page buffers coupled to different bit lines are used for distributing data subject to a same program or read operation.

* * * * *